US006320369B1

(12) United States Patent
Hidaka et al.

(10) Patent No.: US 6,320,369 B1
(45) Date of Patent: *Nov. 20, 2001

(54) SUPERCONDUCTING CURRENT MEASURING CIRCUIT HAVING DETECTION LOOP

(75) Inventors: Mutsuo Hidaka; Shuichi Tahara, both of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/413,536

(22) Filed: Oct. 6, 1999

(30) Foreign Application Priority Data

Oct. 7, 1998 (JP) .................................. 10-285053

(51) Int. Cl.[7] .......................... G01R 33/00; G01N 27/00; G01V 3/00; H01L 39/00; H01L 23/48

(52) U.S. Cl. .................... 324/117 R; 324/71.6; 324/248; 505/160; 505/162; 505/190; 505/191

(58) Field of Search ................................ 324/117 R, 248, 324/71.6; 73/504.01; 365/162; 505/160, 162, 190, 191

(56) References Cited

U.S. PATENT DOCUMENTS

| 3,657,927 | * | 4/1972 | Tyson | 73/504.01 |
| 4,151,605 | * | 4/1979 | Faris | 365/162 |
| 4,249,094 | * | 2/1981 | Fulton | 327/367 |
| 4,330,841 | * | 5/1982 | Yamada et al. | 708/700 |
| 4,401,900 | * | 8/1983 | Faris | 327/367 |
| 4,489,274 | * | 12/1984 | Berlincourt | 324/248 |
| 4,491,795 | * | 1/1985 | Gelinas | 324/248 |

(List continued on next page.)

FOREIGN PATENT DOCUMENTS

| 4-235369 | 8/1992 | (JP) . |
| 7-135099 | 5/1995 | (JP) . |
| 7-174834 | 7/1995 | (JP) . |
| 7-221614 | 8/1995 | (JP) . |
| 08-068837 | 3/1996 | (JP) . |

OTHER PUBLICATIONS

Pitzius, et al., "Ultrahigh–Resolution Scanning SQUID Microscopy", pp. 395–398, Oct. 6, 1999 (Per Amendment Filed on Feb. 13, 2001, Paper #7).

Harada, et al., "Time Domain Magnetic Field Waveform Measurement near Printed Circuit Boards", Transactions of The Institute of Electrical Engineers of Japan, vol. 117–A, No. 5, May 1997, pp. 523–530.

Hidaka, et al., "A High–Tc Superconductor Josephson Sampler", IEICE Transactions on Electronics, vol. E80–C, No. 10, Oct. 1997, pp. 1226–1232.

Hidaka, et al., "Measurement of a Signal Current waveform by a High–Tc Superconductor sampler Circuit with a high time resolution", 45th Applied Physics Association Meeting of Japan, Meeting No. 28a–Z–11, Mar. 1998, p. 225.

Oyo Buturi, vol. 67. No. 4, Apr. 1998, pp. 449–545.

Ruggiero, et al., "Superconducting Devices", pp. 51–79, 1990.

*Primary Examiner*—Glenn W. Brown
*Assistant Examiner*—Wasseen H. Hamdan
(74) *Attorney, Agent, or Firm*—McGinn & Gibb, PLLC

(57) ABSTRACT

A superconducting current measuring circuit is provided with a detection loop through which a current flows by the influence of a magnetic field generated by a measurement target current. The detection loop contains a superconductor. The superconducting current measuring circuit is also provided with a superconducting sampler circuit for measuring the current flowing through the detection loop.

2 Claims, 14 Drawing Sheets

U.S. PATENT DOCUMENTS 4,710,651 * 12/1987 Suzuki ..................................... 326/5
4,713,562 * 12/1987 Hasua et al. ............................. 326/6
4,875,010 * 10/1989 Yokosawa et al. .................. 324/248
4,947,118 * 8/1990 Fujimaki .............................. 324/248
5,155,434 * 10/1992 Fujimaki .............................. 324/248

* cited by examiner

SUPERCONDUCTING CURRENT
MEASURING CIRCUITS

SUPERCONDUCTING CURRENT MEASURING CIRCUIT HAVING DETECTION LOOP

BACKGROUND OF THE INVENTION

1. Field of the Invention

The present invention relates to a superconducting current measuring circuit and a superconducting current measuring device using a superconductor and suited for measuring a current waveform with high time accuracy.

2. Description of the Related Art

There have been conventionally known some techniques for providing means for measuring the waveform of a current flowing through wiring. FIG. 1 is a typical view showing a conventional current measuring method. If a value Z of impedance of a wiring 51 is known, a voltage V between a first end 53 and a second end 54 of the wiring 51 is measured by a semiconductor sampler 52, which can measure a voltage with time accuracy of several picoseconds. Using the measured voltage V, a current I is obtained according to a formula of I=V/Z. This is an ordinary method, which method will be referred to as "the first prior art" hereinafter.

There is also known a method of measuring a current waveform by means of a magnetic sensor using electromagnetic inductance, as described in the Transactions of The Institute of Electrical Engineers of Japan, Vol.117-A, No.5, May, 1997, pages 523 to 530. This method will be referred to as "the second prior art" hereinafter. FIG. 2 is a typical view showing a measuring method according to the second prior art. In this method, the output voltage of a magnetic sensor 55 using electromagnetic induction is measured by a spectrum analyzer 56. Next, the waveform of a current flowing through a wiring 14 on a measurement target 13 is obtained as the deconvolution of a sensor factor which is a ratio of a received magnetic field with each frequency to an output voltage.

Furthermore, there is proposed a measuring method using a superconducting loop (Japanese Patent Unexamined Application Publication No. 7-135099). This method will be referred to as "the third prior art" hereinafter. FIG. 3 is a typical view showing a measuring method according to the third prior art. In this method, a magnetic field generated due to an ion beam (flow of charged particles=current) is detected by a superconducting loop (DC-SQUID) 59 including Josephson junctions 57 and 58 and an ion beam current is measured. In the third prior art, the voltage between both ends of the superconducting loop 59 biased with a current source 60 so as to provide a constant voltage state is measured by a voltmeter 61. The displacement of the voltage generated when a magnetic field is applied in this state from the initial voltage value is fed back to the current source 60 and bias current is adjusted to thereby make voltage constant. The magnitude of the applied magnetic field is measured from the variation of the bias current at this time and an ion beam current value is obtained.

A superconducting sampler is described in the IEICE TRANSACTIONS ON ELECTRONICS, VOL. E80-C, No. 10, October, 1997, pages 1226 to 1232. FIG. 4A is a circuit diagram showing the superconducting sampler described therein. In addition, the Extended Abstract of the 45th Applied Physics Association Meeting of Japan, meeting No. 28a-Z-11, March, 1998, page I-225 describes that if the superconducting sampler mentioned in the IEICE TRANSACTIONS ON ELECTRONICS, VOL. E80-C, No. 10, October, 1997, pages 1226 to 1232 is used, it is possible to measure current waveforms with time accuracy of picoseconds. FIG. 4B is a timing chart showing the operation of the superconducting sampler shown in FIG. 4A.

First, a feedback current $I_f$ is supplied to the first input terminal 171, thereafter, a measurement target current $I_S$ is inputted. If a trigger current $I_{tr}$ is supplied from the second input terminal 172 at certain timing, a first Josephson junction 173 is switched on. As a result, an SFQ (Single Flux Quantum) enters a first superconducting loop including the first Josephson junction 173, a second Josephson junction 174, a third Josephson junction 175 and a first inductance 178. Following this, a first circulating superconducting current flows through the first superconducting loop.

In addition, an SFQ opposite in direction to the above SFQ enters a second superconducting loop including the first Josephson junction 173 and a second inductance 179. If the critical current value of the second Josephson junction 174 is set lower than the first circulating superconducting current, the current flowing through the second Josephson junction 174 falls while rising by the switching of the second Josephson junction 174. As a result, a pulse current $I_P$ occurs and flows into the third Josephson junction 175.

The third Josephson junction 175 is referred to as a comparator junction. Since the feedback current $I_f$ and the measurement target current $I_S$ already flow through this junction, the feedback current $I_f$, the measurement target current $I_s$ and the pulse current $I_P$ are added up to one another. If the sum of the three currents is equal to or higher than the critical current of the third Josephson junction 175, the third Josephson junction 175 is switched on. As a result, a third circulating superconducting current flows through a third superconducting loop including the third Josephson junction 175, a third inductance 180 and a coupling inductance 181 coupled with a readout SQUID (Superconducting quantum interference device). The third circulating superconducting current causes the generation of voltage between both ends of the readout SQUID including the fourth Josephson junction 176 and the fifth Josephson junction 177. If the sum of the three currents is less than the critical current value of the third Josephson junction 175, the junction 175 is not switched on and no voltage is generated between both ends of the readout SQUID.

If negative currents are carried as the second circulating superconducting current and the third circulating superconducting current at the end of each measurement cycle, the first Josephson junction 173 and the third Josephson junction 175 are switched and the superconducting sampler is reset.

The above operation is repeatedly conducted while changing the value of the feedback current $I_f$, and the lowest feedback current $I_f$ with which an output voltage occurs is obtained. The obtained value is compared with the value of the lowest feedback current $I_f$ with which an output voltage occurs while the measurement target current $I_S$ is 0, thereby obtaining the value of the measurement target current $I_S$ at timing at which the pulse current $I_P$ occurs. Next, the timing for supplying a trigger current $I_{tr}$ is changed, timing at which a pulse current $I_P$ occurs is shifted and the same measurement operation is repeated. In this way, the waveform of the measurement target current $I_S$ can be measured using the superconducting sampler shown in FIG. 4A. The above-stated measuring method will be referred to as "the fourth prior art" hereinafter.

The first prior art shown in FIG. 1 is, however, applicable only to a case where the impedance of wiring is known. Normally, there are many cases where the impedance of wiring is not known. As for, for example, in regard to wiring of a semiconductor large scale integrated circuit (LSI), since contact holes exist and wiring structure is complicated, the inductance of the wiring is normally unknown. In this case, a current waveform cannot be measured using the semiconductor sampler.

The second prior art shown in FIG. 2 has disadvantages in that detection sensitivity for low frequency components is low and waveform reproducibility is not satisfactory since electromagnetic induction is employed. Besides, the measurable upper limit frequency which is determined with an L/R time constant where R is the resistance of a sensor and L is an inductance, is limited to as low as 1 GHz.

The third prior art shown in FIG. 3 has disadvantages in that it takes long time to feed back a bias current for keeping the voltage of the SQUID constant and measurement time accuracy is considerably low.

The fourth prior art shown in FIGS. 4A and 4B has an advantage in that a current waveform can be measured with high time accuracy. However, the fourth prior art requires directly supplying a measurement target current to the sampler through wiring, so that non-contact measurement cannot be made. For this reason, the fourth prior art has a disadvantage in that a measurement target current may be greatly influenced depending on measurement type. On the other hand, there are some cases where a current is not necessarily measured in a non-contact manner such as a case where a measurement target current flows through the ground. Nevertheless, due to the fact that the superconducting sampler is arranged under low temperature environment when the sampler is used, it is necessary to introduce the measurement target current from a measurement target at room temperature to this low temperature environment using a long signal line. As a result, if frequency becomes higher, problems, such as the distortion of a current waveform and crosstalk, occurs.

BRIEF SUMMARY OF THE INVENTION

It is, therefore, an object of the present invention to provide a superconducting current measuring circuit capable of measuring the waveform of a measurement target current flowing through an arbitrary wiring with high accuracy and without contact and a superconducting current measuring device having the same.

According to one aspect of the present invention, a superconducting current measuring circuit may comprise a detection loop through which a shield current flows by influence of a magnetic field generated by a measurement target current and a superconducting sampler circuit measuring the shield current. The detection loop contains a superconductor.

According to the present invention, a current flows through the detection loop by the magnetic field generated in the detection loop by the measurement target current and the current is measured by the superconducting sampler circuit with high time accuracy. Due to this, it is possible to measure the waveform of the current flowing through the measurement target without contact and with high time accuracy and high current accuracy.

The detection loop may comprise a closed loop.

The superconducting sampler circuit may comprise a Josephson junction provided at the detection loop.

If part of the detection loop is included in the Josephson junction of the superconducting sampler circuit, high detection accuracy can be obtained.

The superconducting sampler circuit may comprise a superconducting loop, the superconducting loop includes a Josephson junction, and the detection loop and the superconducting loop may be magnetically coupled.

If the detection loop is magnetically coupled to a superconducting loop including the comparator junction of the superconducting sampler circuit, it is possible to reduce the influence of the operation of the superconducting sampler circuit on the current induced to the detection loop.

The superconducting sampler circuit may comprise a superconducting loop, the superconducting loop including a Josephson junction and an input wiring, and the detection loop and the input wiring may be magnetically coupled.

By magnetically coupling the detection loop to the input wiring for supplying a current to the Josephson junction of the superconducting sampler circuit, it is possible to measure the primary differential value of the measurement target current.

The detection loop may comprise a coil of gradiometer structure.

If the detection loop is of gradiometer structure, the influence of environmental magnetic fields can be reduced and more accurate measurement can be, thereby, made.

The superconducting current measuring circuit may further comprise a magnetic field collector which collects the magnetic field generated by the measurement target current. The magnetic field collector may have a structure of surrounding a measurement target region with a wall containing high permeability material.

If the detection loop comprises a magnetic field collector, the magnetic field generated by the measurement target current can be converted to a current more efficiently, thereby enhancing measurement sensitivity.

The magnetic field collector may comprise a probe containing a soft magnetic material, the probe being arranged such that a tip end thereof faces a measurement target through which the measurement target current flows and another end penetrates into the detection loop.

If the magnetic collector is constituted by a soft magnetic material probe, the magnetic field in the vicinity of the measurement target current can be absorbed more efficiently, thereby enhancing spatial resolution for measurement.

The probe may have a rectangular section provided on the tip end thereof.

If the soft magnetic material probe has a rectangular tip end, it is possible to collect a magnetic field generated by a current flowing through an elongated measurement target such as an LSI wiring and a printed circuit board wiring more efficiently.

The superconducting current measuring circuit may further comprise a superconducting ground plane stacked on the superconducting sampler circuit.

If the superconducting ground plane is stacked only on the portion of the superconducting sampler, the magnetic field generated by the measurement target current can be shielded and can be prevented from adversely affecting the operation of the superconducting sampler circuit.

The detection loop and the superconducting sampler circuit may contain a high temperature superconductor.

If the detection loop and the superconducting sampler are constituted by high temperature superconductors, it is possible to greatly reduce cost required for cooling operation. In addition, the temperature difference between the current measuring circuit and the measurement target is smaller than that in a case of using a low temperature superconductor for the current measuring circuit. It is, therefore, possible to reduce the influence of radiation heat.

According to another aspect of the present invention, a combined superconducting current measuring circuit may comprise a plurality of above-described superconducting current measuring circuits.

If a plurality of current measuring circuits of the present invention are used, it is possible to obtain information on the position of the measurement target current and information on the state of the space propagation of the measurement target current and the like from the difference in detection intensity among the respective current measuring circuits.

The plurality of superconducting current measuring circuits may be arranged in an array.

If the current measuring circuits of the present invention are arranged in an array, it is possible to measure currents in a wide range of space at once and to observe the state of the space propagation of currents.

According to another aspect of the present invention, a superconducting current measuring circuit may comprise a detection loop which detects a magnetic field generated by a measurement target current as a current, the detection loop including a superconducting closed loop, and a superconducting sampler circuit which measures a current flowing through the detection loop.

According to another aspect of the present invention, a superconducting current measuring device may comprise a vacuum chamber in which a superconducting current measuring circuit or a combined superconducting current measuring circuit which are one of the above-stated circuits and a measurement target are arranged, the measurement target current flowing through the measurement target.

According to the present invention, the current measuring circuits and the measurement target are arranged in the same vacuum to thereby allow them to be closer to each other to have a desired distance. Since they are thermally insulated from each other by vacuum, the flow of heat from the target measurement to the current measuring circuits is limited to the flow of radiation heat and they have less thermal influence on each other.

The device may further comprise a magnetic shield which shields a magnetic flow from an outside of the vacuum chamber into the measurement target, whereby it is possible to shield external magnetic fields and to make more reliable measurement.

The device may further comprise a refrigerating unit which cools the superconducting current measuring circuit or the combined superconducting current measuring circuit.

If a refrigerating unit is used to cool the current measuring circuit made of a superconductor, convenience is improved compared with a case of using a freezing mixture such as liquid helium. The refrigerating unit of this type is described in, for example, OYO BUTURI, Vol. 67, No. 4, April, 1998, pages 449 to 454.

The device may further comprise a circuit which supplies at least one of a current and a voltage to the measurement target.

If the measurement target is an electric circuit or the like, it is possible to deal with the measurement of a current flowing through an LSI wiring or a printed circuit board wiring by providing means for supplying current or voltage.

The device may further comprise an alignment component used for aligning the superconducting current measuring circuit or the combined superconducting current measuring circuit to the measurement target To specify the current measurement place, means for aligning the current measuring circuit to the measurement target is provided, thereby making it possible to measure a current at a desired place of the measurement target.

The device may further comprise a position adjusting unit which adjusts a relatively positional relationship between the superconducting current measuring circuit or the combined superconducting current measuring circuit and the measurement target in a plane substantially parallel to a main plain of the measurement target.

If the current measuring circuit can scan the measurement target in plane direction, information on the space distribution of the measurement target current and the like can be obtained. That is, by providing means for varying the relatively positional relationship between the current measuring circuit and the measurement target in horizontal direction and measuring the measuring target current, the current distribution in a place on the measurement target can be measured.

The device may further comprise a distance adjusting unit which adjusts a distance between the superconducting current measuring circuit or the combined superconducting current measuring circuit and the measurement target.

The maximum current value which can be measured by the superconducting sampler is several hundreds of micro-ampers. Due to this, depending on the magnitude of the measurement target current, it is preferable to adjust the distance between the current measuring circuit and the measurement target and to thereby control the value of the current induced to the detection loop. Thus, by providing means for adjusting the distance between the current measuring circuit and the measurement target, it is possible to adjust the value of the shielding current induced to the detection loop to be suited for measurement using the superconducting sampler circuit.

The device may further comprise a shield member which shields radiation-heat from the measurement target to the superconducting current measuring circuit or the combined superconducting current measuring circuit.

By providing a heat shield between the current measuring circuit and the measurement target, the thermal interaction between the current measuring circuit and the measurement target can be reduced.

The device may further comprise an electromagnetic wave irradiation unit which radiates a high frequency electromagnetic wave onto the measurement target.

By providing means for radiating a high frequency electromagnetic wave such as a laser beam onto the measurement target, various target currents such as a current due to a photoelectric effect can be measured.

The device may further comprise a preliminary exhaust chamber, a gate valve provided between the preliminary exhaust chamber and the vacuum chamber, an exhaust unit which exhausts an interior of the preliminary exhaust chamber, and a carrier unit which carries the measurement target between the vacuum chamber and the preliminary exhaust chamber.

The current measuring circuit operates at low temperature. Due to this, if the vacuum of the current measuring device is broken before the temperature of the current measuring circuit returns to room temperature, drops of water adhere to the current measuring circuit and circuit characteristics may possibly deteriorate. Considering this, it is essential to return the temperature of the current measuring circuit to room temperature before the vacuum of the current measuring device of the present invention is broken. Thus, the current measuring device according to the present invention comprises a preliminary exhaust chamber for exchanging one measurement target for another, preliminary exhaust means, a gate valve and carrying means. If the measurement target is exchanged for another through the preliminary exhaust chamber, there is no need to make the overall vacuum chamber in an atmospheric environment. Owing to this, there is no need to return the temperature of the current measuring circuit to room temperature and measurement target exchange can be made in a shorter time.

DESCRIPTION OF THE PREFERRED EMBODIMENTS

Now, superconducting current measuring circuits and a superconducting current measuring device in the embodiments according to the present invention will be concretely described with reference to the accompanying drawings.

Figure 5:
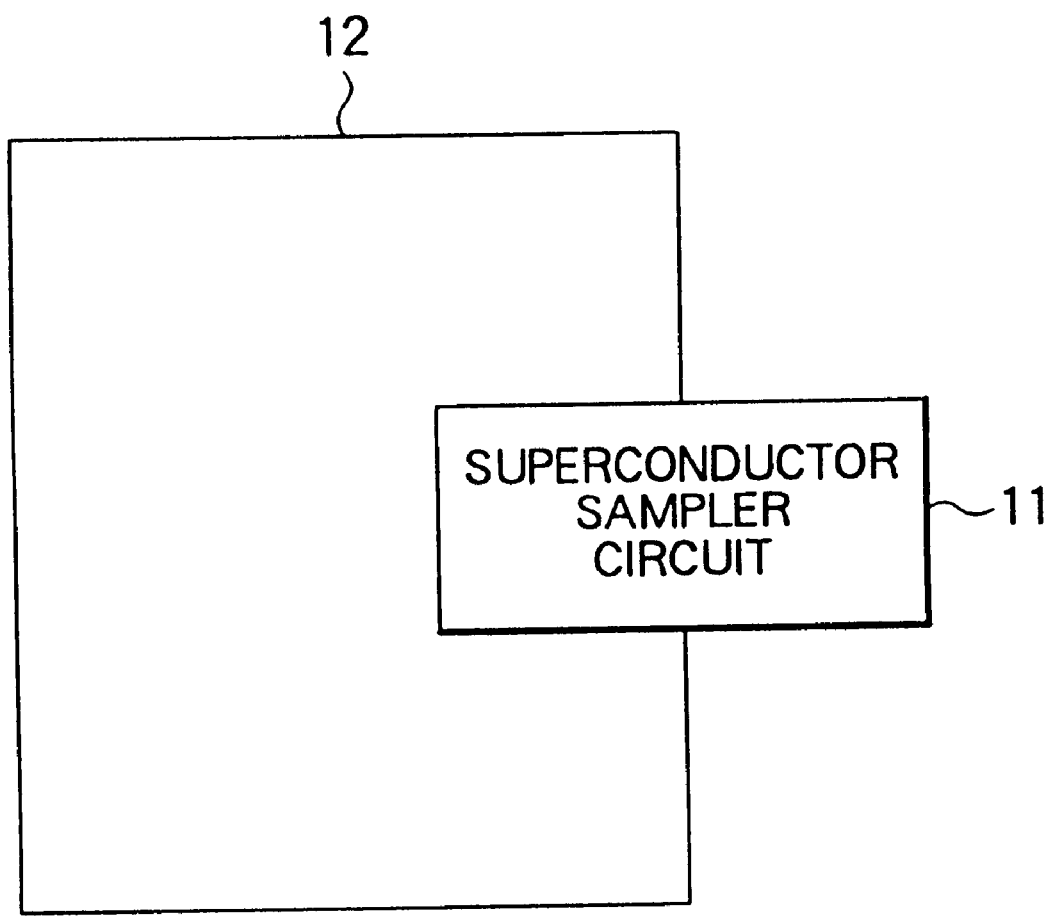
FIG. 5 is a typical view showing a superconducting current measuring circuit in the first embodiment according the present invention.
Figure 6:
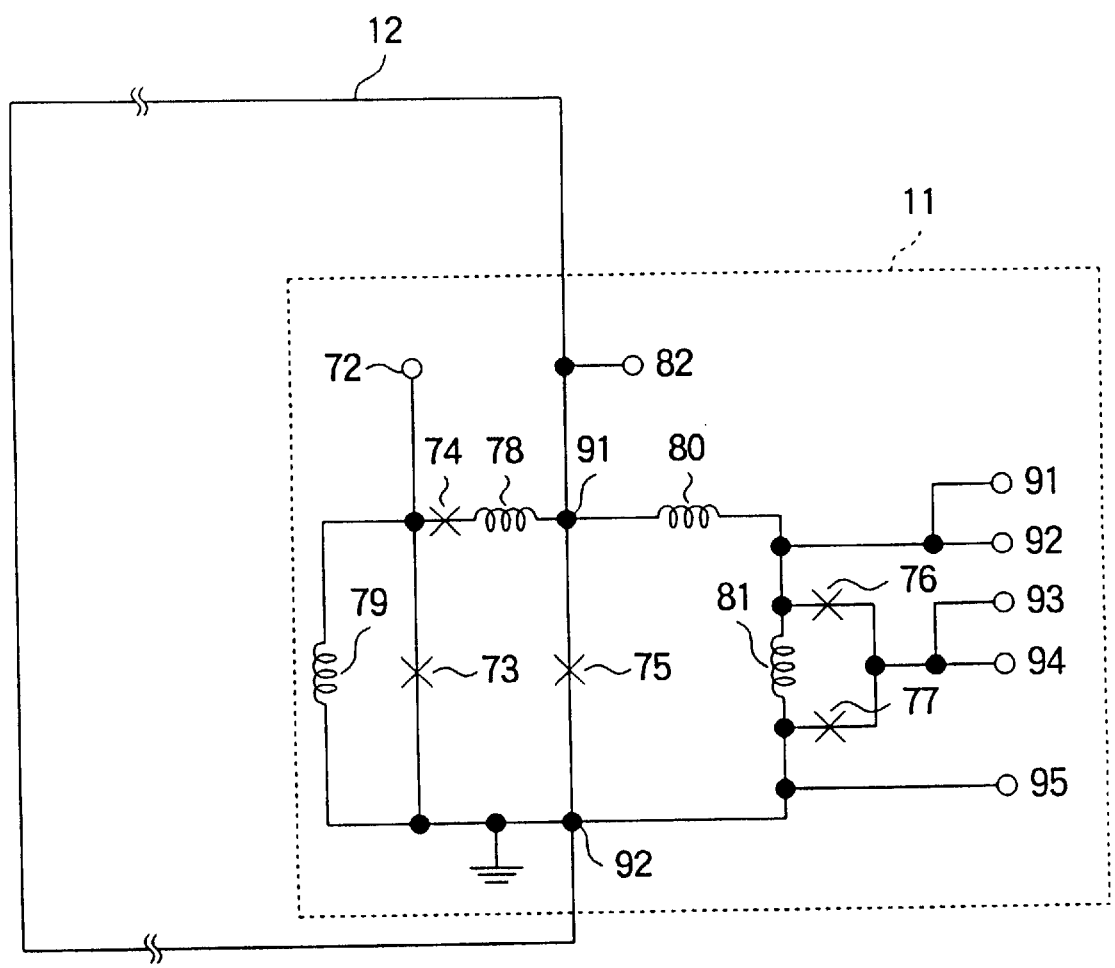
FIG. 6 is a circuit diagram concretely showing a perconducting sampler circuit 11 shown in FIG. 5.
Figure 6:
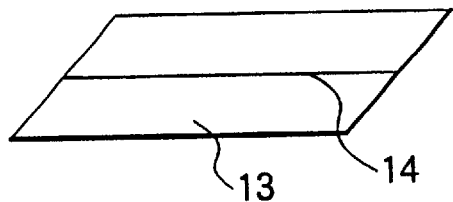

FIG. 5 is a typical view showing a superconducting current measuring circuit in the first embodiment according to the present invention. FIG. 6 is a circuit diagram concretely showing a superconducting sampler 11 shown in FIG. 5.

In this embodiment, there is provided a detection loop 12 through which a current flows by the influence of a magnetic field generated by a current flowing through a wiring 14 on a measurement target 13. The detection loop 12 preferably Consists of a superconductor. There is also provided a superconducting sampler circuit 11 which measures the current flowing through the wiring 14 using the current flowing through the detection loop 12.

As shown in FIG. 6, a loop connected to the detection loop 12 at two joints 91 and 92 is formed on the superconducting sampler circuit 11. In this loop, a first inductance 78, a second Josephson junction 74, a second inductance 79, a coupling inductance 81 and a third inductance 80 are connected in series from the joint 91 side in this order. The joint 92 is provided between the inductances 79 and 81. A first Josephson junction 73 is connected in parallel to the second inductance 79. An input terminal 72 is connected between the second Josephson junction 74 and the second inductance 79 and an input terminal 82 is provided on the detection loop 12.

A fourth Josephson junction 76 is connected to the joint 91-side of the coupling inductance 81 and a fifth Josephson junction 77 is connected to the joint 92-side of the coupling inductance 81. The other ends of the fourth Josephson junction 76 and the fifth Josephson junction 77 are connected to a common joint. A positive electrode voltage terminal 93 and a positive electrode current terminal 94 are connected to the common joint.

Further, a negative electrode voltage terminal 91 and a negative electrode current terminal 92 are connected between the inductances 80 and 81. A negative electrode current terminal 95 is connected between the inductance 81 and the joint 92. A voltage signal outputted from the readout SQUID is measured using the voltage terminals 91 and 93 and a current signal outputted from the readout SQUID is measured using the current terminals 92, 94 and 95.

The critical current values of the first Josephson junction 73 and the third Josephson junction 75 are, for example, 0.5 mA. The critical current values of the second Josephson junction 74, the fourth Josephson junction 76 and the fifth Josephson junction 77 are, for example, 0.25 mA.

The inductance value of the first inductance 78 is, for example, 3.7 pH. The inductance values of the second inductance 79 and the third inductance 80 are, for example, 5 pH. The inductance value of the coupling inductance 81 is, or example, 2 pH.

Those values are design values. Even if the values are shifted from the above, the superconducting sampler circuit 11 normally functions as long as they fall within certain margins.

In the first embodiment constituted as stated above, first, a feedback current $I_f$ is supplied to the input terminal 82, thereafter, a shield current $I_S$ is inputted. If a trigger current $I_{tr}$ is supplied from the input terminal 72 at certain timing, the first Josephson junction 73 is switched on. As a result, an SFQ (Single Flux Quantum) enters a first superconducting loop including the first Josephson junction 73, the second Josephson junction 74, the third Josephson junction 75 and the first inductance 78. Following this, a first circulating superconducting current flows through the first superconducting loop.

In addition, an SFQ opposite in direction to the above SFQ enters a second superconducting loop including the first Josephson junction 73 and the second inductance 79. If the critical current value of the second Josephson junction 74 is set lower than the first circulating superconducting current, the current flowing through the second Josephson junction 74 falls while rising by the switching of the second Josephson junction 74. As a result, a pulse current $I_P$ occurs and flows into the third Josephson junction 75.

Since the feedback current $I_f$ and the measurement target current Is already flow through this junction, the feedback current $I_f$, the measurement target current $I_s$ and the pulse current $I_P$ are added up to one another. If the sum of the three currents is equal to or higher than the critical current of the third Josephson junction 75, the third Josephson junction 75 is switched on. As a result, a third circulating superconducting current flows through a third superconducting loop including the third Josephson junction 75, the third inductance 80 and the coupling inductance 81 coupled with a readout SQUID (Superconducting quantum interference device). The third circulating superconducting current causes the generation of voltage between both ends of the readout SQUID including the fourth Josephson junction 76 and the fifth Josephson junction 77. If the sum of the three currents is less than the critical current value of the third Josephson junction 75, the junction 75 is not switched on and no voltage is generated between both ends of the readout SQUID.

If negative currents are carried as the second circulating superconducting current and the third circulating superconducting current at the end of each measurement cycle, the first Josephson junction 73 and the third Josephson junction 75 are switched and the superconducting sampler is reset.

The above operation is repeatedly conducted while changing the value of the feedback current $I_f$, and the lowest feedback current $I_f$ with which an output voltage occurs is obtained. The obtained value is compared with the value of the lowest feedback current $I_f$ with which an output voltage occurs while the measurement target current $I_S$ is 0, thereby obtaining the value of the measurement target current $I_S$ at timing at which the pulse current $I_P$ occurs. Next, the timing for supplying a trigger current $I_{tr}$ is changed, timing at which a pulse current $I_P$ occurs is shifted and the same measurement operation is repeated. In this way, the waveform of the measurement target current $I_S$ can be measured.

Generally, if a measurement target current I flows through an infinite-length straight wiring, a magnetic flux density B formed at a position distant from the wiring by d is expressed by the following Formula (1):

$$B = \mu_0 \times I / 2d \tag{1}$$

In the Formula (1), $\mu_0$ is permeability in vacuum.

From the Formula (1), if a measurement target current of 1.0 mA flows through the wiring 14 on the measurement target 13 and the distance between the wiring 14 and the detection loop 12 is 10 mm, then the density of the magnetic flux applied to the detection loop 12 is $2.0 \times 10^{-8}$ Wb/m².

If a magnetic flux is applied to a superconducting closed loop, a shielding current flows through the closed loop to shield the magnetic field applied to the closed loop by means of the diamagnetism (Meissner effect) of the superconductor. If the effective area of the superconducting loop is S, inductance is L and the applied magnetic flux is B, the magnitude Icir of this shielding current is expressed by the following Formula (2):

$$I\text{cir} = BS/L \tag{2}$$

From the Formula (2), if the effective area of the detection loop 12 is 1 mm² and inductance is 200 pH, the shielding current induced to the detection loop 12 by the magnetic flux resulting from the measurement target current is estimated as 100 µA.

The reaction speed of the superconducting detection loop 12 to an applied magnetic flux is limited by a time constant of $(LC)^{1/2}$ regarding the inductance L of the detection loop 12 and the capacitance C between the detection loop 12 and the wiring 14 through which the measurement target current flows. However, due to the long distance between the detection loop 12 and the wiring 14, this time constant is sufficiently low. If the areas of the detection loop 12 and the wiring 14 facing each other are 1 mm² and the distance between the detection loop 12 and the wiring 14 is 1 cm, for example, the capacitance C is about 1 fF. Thus, if the inductance L is 200 pH, the time constant is 400 femto-seconds.

In case of an LSI wiring or the like, the width of the wiring 14 is 10 µm or less and the time constant becomes smaller than the above. The time accuracy of the superconducting sampler circuit 11 is in the order of several pico-seconds. It is considered, therefore, that the deterioration of time accuracy due to the reaction time of the detection loop 12 is negligible.

Meanwhile, from the above Formulas (1) and (2), the relationship between the shielding current Icir induced to the detection loop 12 and the measurement target current I is expressed by the following Formula (3):

$$I\text{cir} = (\mu_0 S/2 \text{ dL}) \times I \tag{3}$$

Namely, the shielding current induced to the detection loop 12 is proportional to the measurement target current and is not dependent on frequency. Since the detection loop 12 is not frequency-dependent, it is possible to obtain the conversion coefficient between the measurement target current I and the shielding current Icir from the measurement employing DC current or the known measurement target current with low frequency. Once the conversion coefficient is obtained, it can be used later without depending on the frequency of the measurement target currents. This is quite a difference from a case of the second prior art where a current flowing through the comparator junction is proportional to the primary time differential value of the measurement target current and is, therefore, largely dependent on frequency. In the second prior art, the magnetic sensor utilizing electromagnetic induction is employed.

The shielding current induced to the detection loop 12 flows through the third Josephson junction (comparator junction) 75 of the superconducting sampler 11 provided on a part of the detection loop 12.

As stated above, a current flowing through the third Josephson junction (comparator junction) 75 can be measured with time accuracy of several pico-seconds by the superconducting sampler 11. It is validated, as described in the Extended Abstract of 45th Applied Physics Association Meeting, Meeting No. 28a-Z-11, March, 1998, page I-225, that the superconducting sampler circuit 11 shown in FIG. 6 can measure up to a current of an amplitude of about 200 µA with time accuracy of five pico-seconds and with current accuracy of 2.5 µA.

Then, the value of the shielding current flowing through the detection loop 12 and measured by the superconducting sampler circuit 11 is multiplied by the conversion coefficient between the measurement target current and the shielding current which has been obtained in advance, thereby allowing measuring the measurement target current with high time accuracy.

As described so far, according to the first embodiment of the present invention, it is possible to measure measurement target current ranging from DC current to high frequency current of several ten giga-hertzs or more with high time accuracy and without contact.

Figure 7:
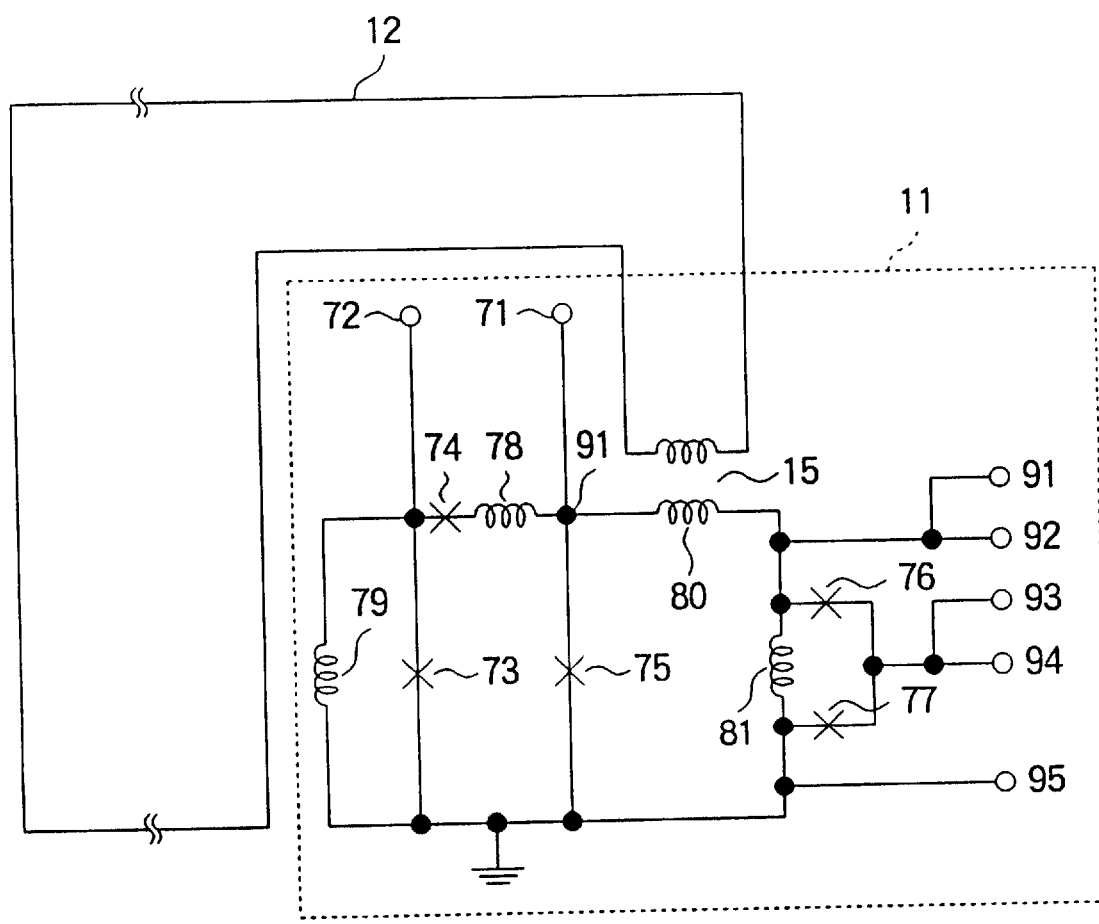
FIG. 7 is a circuit diagram showing a superconducting current measuring circuit in the second embodiment according to the present invention.
Figure 7:
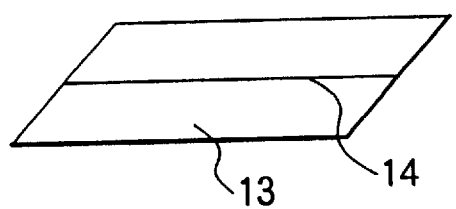

Next, the second embodiment according to the present invention will be described. In this embodiment, a detection loop and a superconducting loop including a comparator junction are magnetically coupled to each other by a mutual inductance. FIG. 7 is a circuit diagram showing a superconducting current measuring circuit in the second embodiment according to the present invention. It is noted that the same constituent elements in the second embodiment shown in FIG. 7 as those in the first embodiment shown in FIG. 6 are denoted by the same reference symbols and the detailed description thereof will not be given herein.

In the first embodiment, the comparator junction 75 of the superconducting sampler circuit 11 is included in part of the detection loop 12. In the second embodiment, the detection loop 12 and the superconducting loop including the comparator junction 75 are magnetically coupled to each other by a first mutual inductance 15. The parameter values of constituent elements for the superconducting sampler circuit 11 are the same as those in the first embodiment.

A shielding current flowing through the detection loop 12 induces a current to the superconducting loop including the comparator junction 75, the third inductance 80 and the coupling inductance 81 by the first mutual conductance 15. The induced current can be measured by the superconducting sampler circuit 11.

In the second embodiment, current slightly falls at a portion at which current is applied to the superconducting loop including the comparator junction 75 from the detection loop 12 and sensitivity is, therefore, slightly inferior to that in the first embodiment. Nevertheless, since high independence is maintained between the detection loop 12 and the superconducting sampler circuit 11, stable operation can be expected.

Figure 8:
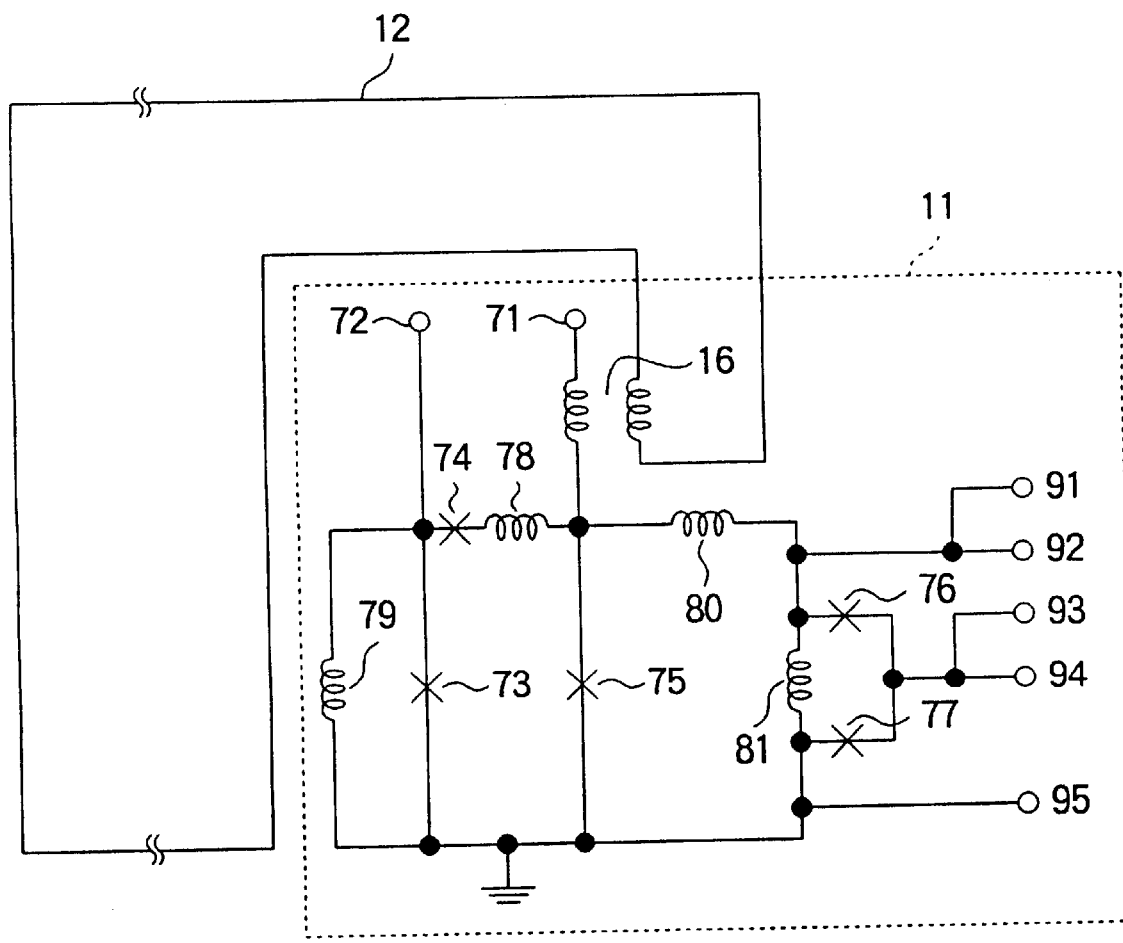
FIG. 8 is a circuit diagram showing a superconducting current measuring circuit in the third embodiment according to the present invention.
Figure 8:
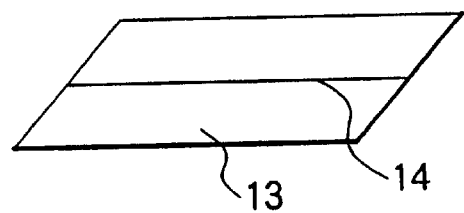

Next, the third embodiment according to the present invention will be described. In this embodiment, a detection loop and wiring for supplying a current to the comparator junction of a superconducting sampler circuit are magnetically coupled to each other by a mutual inductance. FIG. 8 is a circuit diagram showing a superconducting measuring circuit in the third embodiment according to the present invention. It is noted that the same constituent elements in the second embodiment shown in FIG. 7 as those in the first embodiment shown in FIG. 6 are denoted by the same reference symbols and the detailed description thereof will not be given herein.

In the third embodiment, the detection loop 12 and wiring for supplying a current to the comparator junction 75, of the superconducting sampler circuit 11 are magnetically coupled by the second mutual inductance 16. An input terminal 71 is connected to the wiring.

In the third embodiment constituted as stated above, the wiring for supplying a current to the comparator junction 75 is not included by a superconducting loop. Due to this, the value of a current flowing through the comparator junction 75 is a primary time differential value of the current induced by electromagnetic induction and flowing through the detection loop 12. Thus, it is possible to measure the primary differential value of a measurement target signal current using the superconducting sampler circuit 11 with high time accuracy.

The magnetic sensor 55 utilizing electromagnetic inductance in the second prior art can measure the primary differential value of a measurement target current, as well. In the second prior art, however, the magnetic sensor 55 includes a resistance component R. Due to this, the upper limit of a measurable frequency is limited by the L/R time constant between the inductance L of the magnetic sensor and the resistance R as described above. Further, since the magnetic sensor 55 includes the resistance component, it is influenced by not only a magnetic field but also an electric field. As a result, it is preferable to get rid of the influence of the electric field during measurement operation. In the third embodiment according to the present invention, by contrast, the circuit does not include a resistance component, no limitation is given to measured frequencies by the L/R time constant and it is possible to measure up to the frequency as high as several tens of giga-hertzs. In addition, the measurement in this embodiment is free from the influence of an electric field since the circuit does not include any resistance component.

Figure 1:
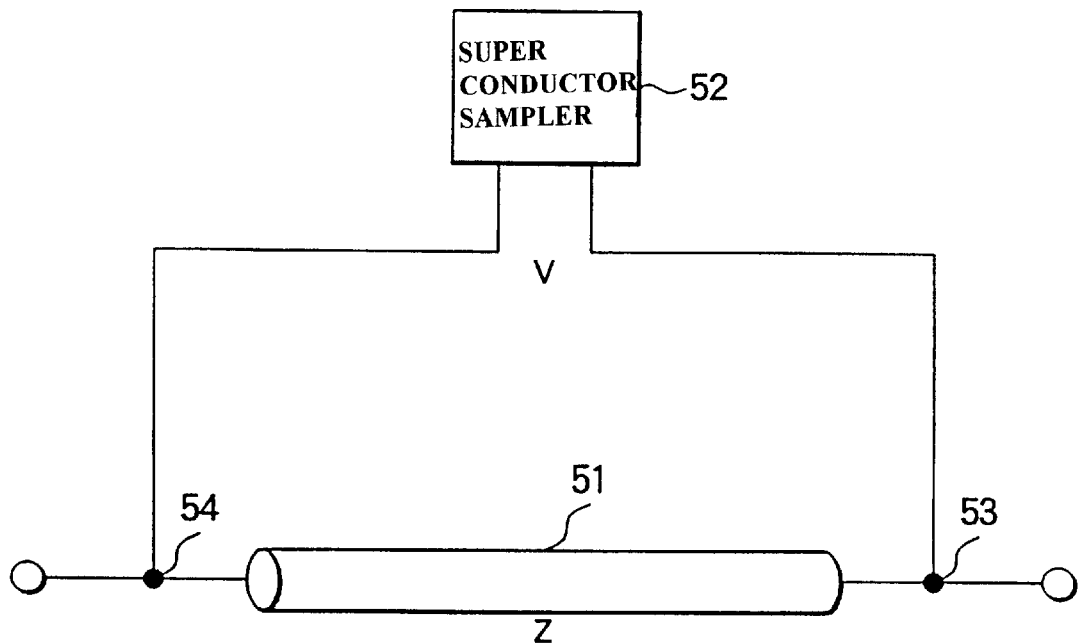
FIG. 1 is a typical view showing a current measuring method according to the first prior art.
Figure 2:
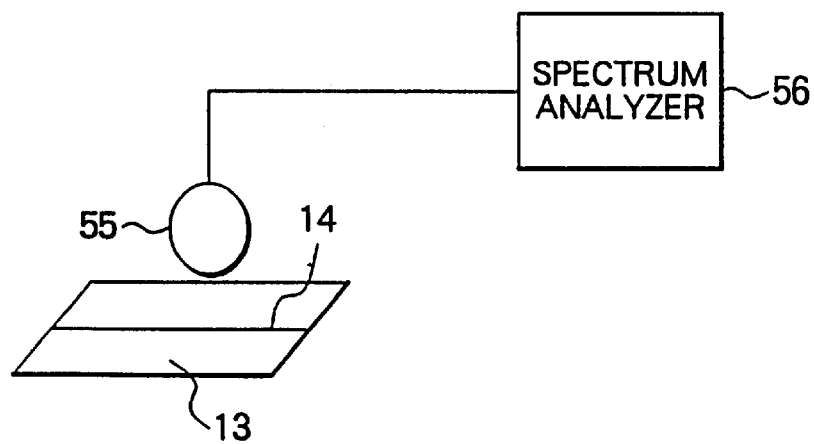
FIG. 2 is a typical view showing a measuring method according to the second prior art.
Figure 3:
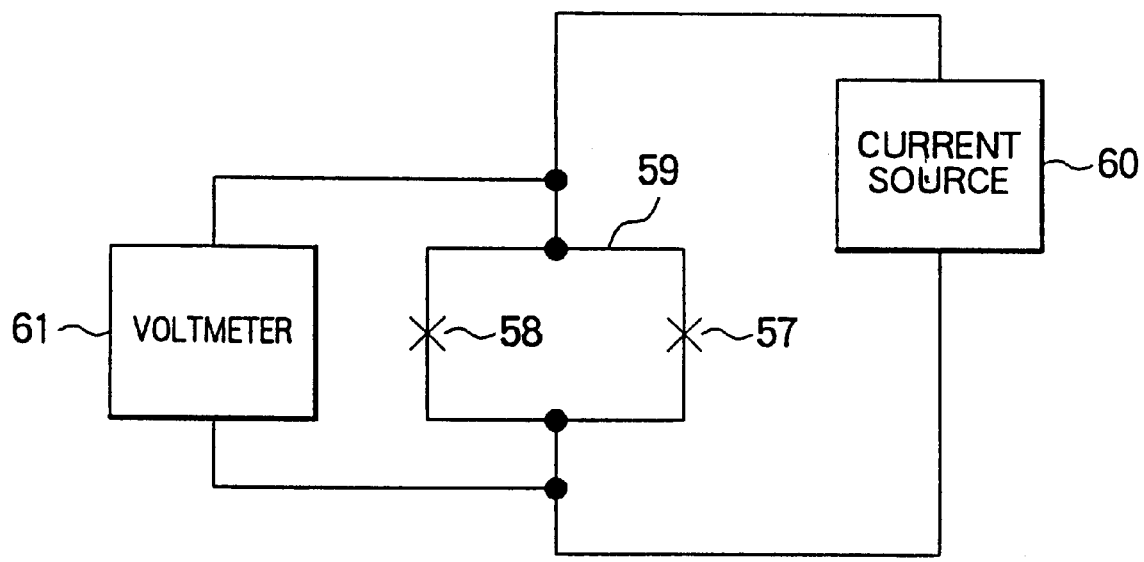
FIG. 3 is a typical view showing a measuring method according to the third prior art.
Figure 4A:
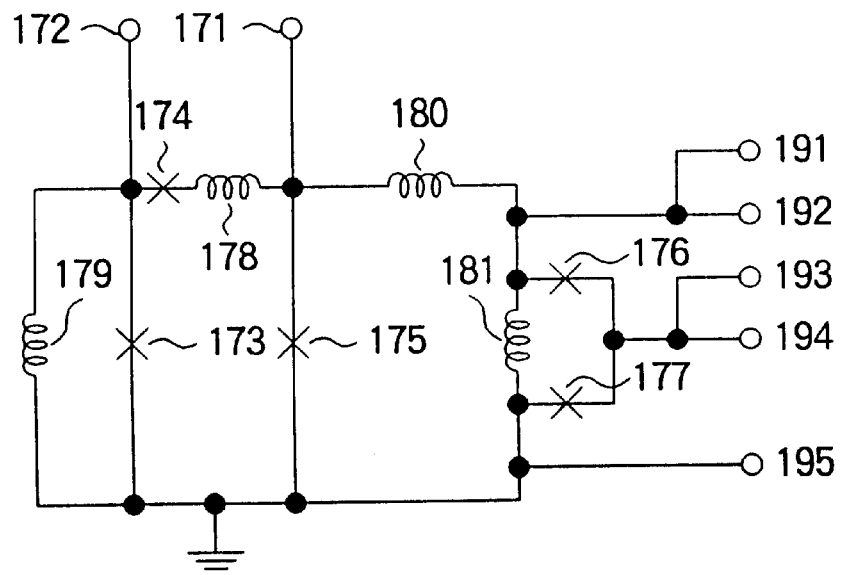
FIG. 4A is a circuit diagram showing a conventional superconducting sampler.
Figure 4B:
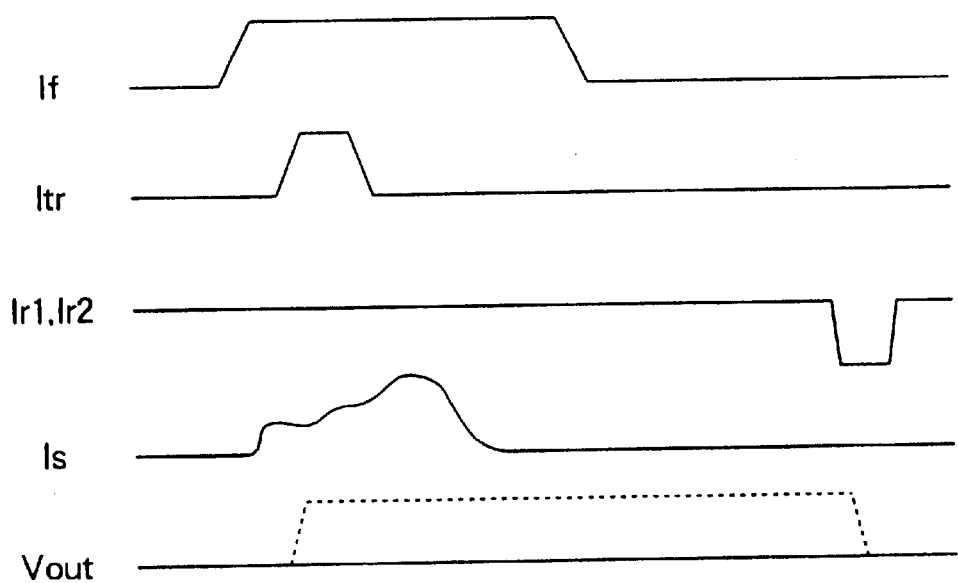
FIG. 4B is a timing chart showing the operation of the superconducting sampler shown in FIG. 4A.

In each of the first to third embodiments, the superconducting sampler circuit using an SFQ (Single Flux Quantum) shown in FIG. 4A is incorporated into the measuring circuit; however, other types of superconducting sampler circuits may be used.

Figure 9:
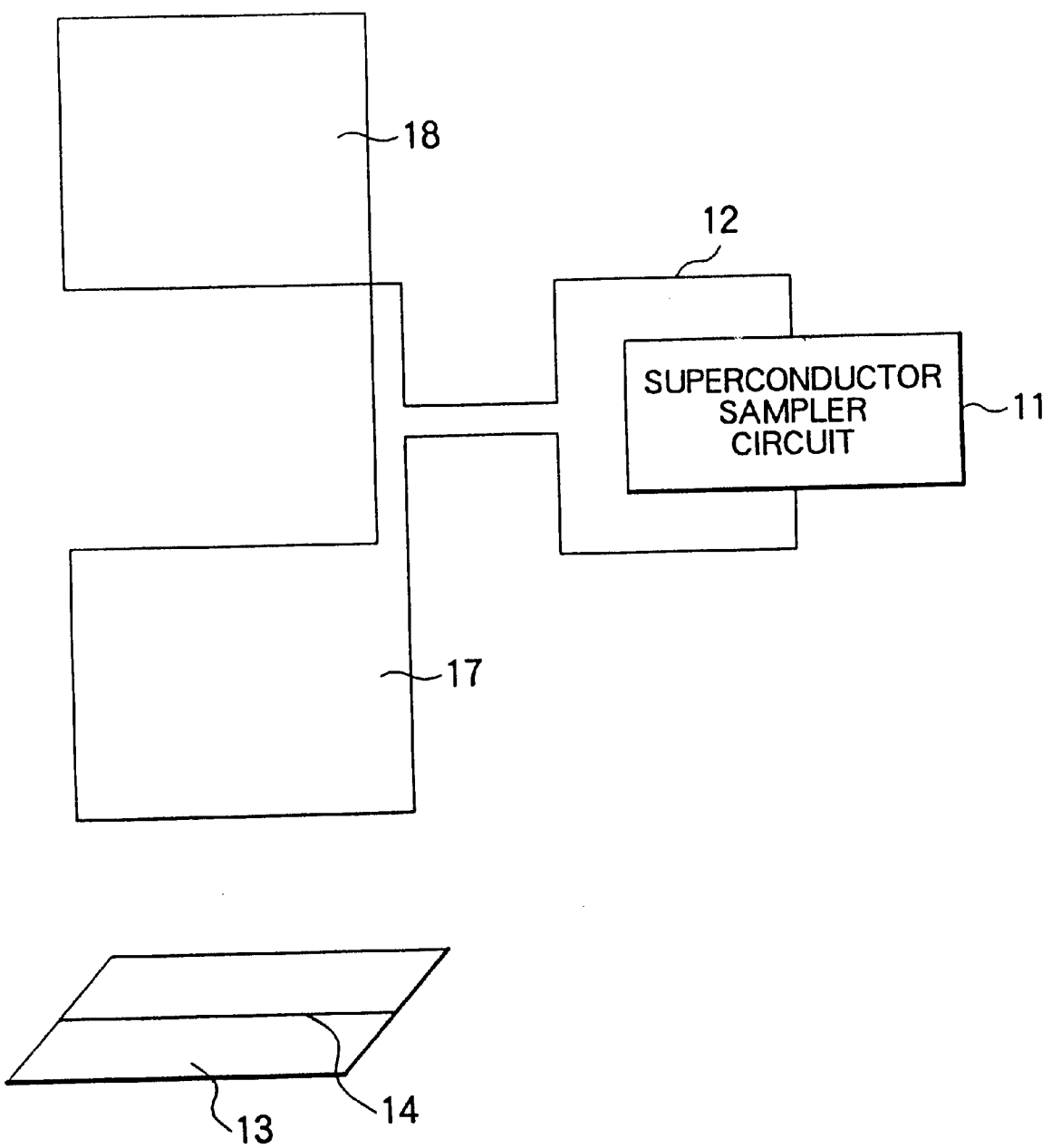
FIG. 9 is a typical view showing a superconducting current measuring circuit in the fourth embodiment according to the present invention.

Next, the fourth embodiment according to the present invention will be described. In this embodiment, a detection loop has gradiometer structure. A gradiometer structure loop is described in, for example, "SUPERCONDUCTING DEVICES" by Steven T. Ruggiero and David A, Rudman, ACADEMIC PRESS, INC. FIG. 9 is a typical view showing a superconducting current measuring circuit in the fourth embodiment according to the present invention.

In the fourth embodiment, the detection loop 12 has gradiometer structure. As shown in FIG. 9, the gradiometer reverses the direction of a shielding current with respect to the same magnetic field by twisting the detection loop once. Therefore, a first loop 17 and a second loop 18 are formed in the detection loop 12. The superconducting sampler circuit 11 has structure shown in one of the first to third embodiments.

The position of the detection loop 12 is determined such that a magnetic field generated by a measurement target current flowing through the wiring 14 on the measurement target 13 is selectively and mainly applied to the first loop 17.

In the fourth embodiment constituted as stated above, if an environmental magnetic field exists from the front surface of the sheet of FIG. 9 toward the back surface thereof, clockwise shielding currents are induced to the first loop 17 and the second loop 18 of the gradiometer structure, respectively. Since the detection loop 12 is twisted once, the currents generated at the first and second loops 17 and 18 by the environmental magnetic field are opposite in direction and cancel each other. As a result, the shielding current resulting from the environmental magnetic field is reduced. On the other hand, since the magnetic field generated by measurement target current flowing through the wiring 14 on the measurement target 13 is mainly applied to the first loop 17, the magnetic fields of the first and second loops 17 and 18 do not cancel each other in the detection loop 12.

As stated above, if the detection loop 12 is of gradiometer structure, a shielding current caused by the environmental magnetic field and the measurement target current flows through the first loop 17 and a shielding current caused by the environmental magnetic field flows through the second loop 18 in opposite direction to that in the first loop 17. As a result, if the effective area of the first loop 17 is equal to that of the second loop 18, the influence of the environmental magnetic field is greatly reduced and the measurement target current can be measured more accurately.

Figure 10:
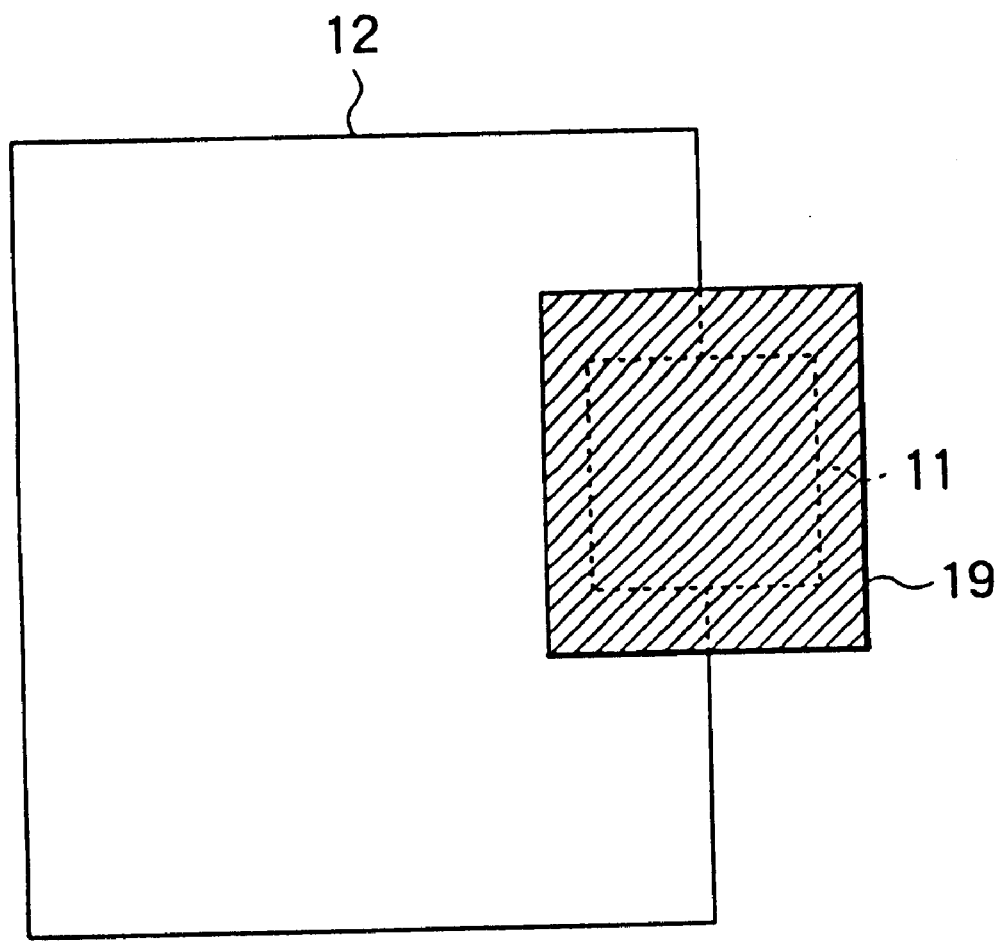
FIG. 10 is a typical view showing a superconducting current measuring circuit in the fifth embodiment according to the present invention.

Next, the fifth embodiment according to the present invention will be described. In this embodiment, a superconducting sampler circuit is covered with a superconducting ground plane. FIG. 10 is a typical view showing a superconducting current measuring circuit in the fifth embodiment according to the present invention.

In the fifth embodiment, the superconducting sampler circuit 11 is completely covered with the superconducting ground plane 19. In FIG. 10, the superconducting ground plane is indicated in hatching. The detection loop 12 is not covered with the superconducting ground plane 19 and exposed except for a portion overlapping the superconducting sampler circuit 11.

A superconducting loop through which a shielding current is carried by a magnetic field and a plurality of Josephson junctions whose critical current values are changed by the magnetic field are provided within the superconducting sampler circuit 11. Owing to this, there is a possibility in the above-described embodiments that a magnetic field generated by a measurement target current influences the operation of the superconducting sampler circuit 11 and accurate current measurement cannot be possibly made.

Generally speaking, a superconductor can effectively shield a magnetic field if the thickness thereof is larger than the length of the magnetic field which enters the superconductor. Considering this, the superconducting sampler circuit 11 is covered with the superconducting ground plane 19, preferably, made of a superconductive thin film, whereby a magnetic field which is to enter the superconducting sampler circuit 11 can be shielded. If the detection loop 12 is covered with the superconducting ground plane 19, however, no magnetic field is applied to the detection loop 12 and no shielding current occurs. Thus, the area of the detection loop 12 covered with the superconducting ground plane 19 is desirably as small as possible.

If $YBa_2Cu_3O_X$ which is a kind of a high temperature superconductor (to be referred to as YBCO hereinafter) is used as a superconductor, the length of magnetic field entering the YBCO is about 200 to 300 nm. Thus, the thickness of the superconducting ground plane 19 is desirably 500 nm or more. The superconducting ground plane 19 may be arranged either below or above the superconducting sampler circuit 11.

The superconductors contained in the superconducting sampler circuit 11 and the detection loop 12 are desirably high temperature superconductors such as YBCO for the following reasons. First, it is desirable that the thermal interaction between the measurement target 13 normally at room temperature and the current measuring circuit containing a superconductor is small. Since a high temperature superconductor operates at a temperature of 50 K compared with a metal superconductor, such as Nb, which needs to be cooled down to 4.2 K, the temperature difference between the high temperature superconductor and the measurement target 13 is small and thermal interaction therebetween is small, as well. Second, the operating temperature of the high temperature superconductor is higher than that of a metal superconductor, so that the high temperature superconductor can be cooled more easily.

A circuit using a metal superconductor such as Nb is superior to that using a high temperature superconductor in control and stability. Due to this, it is effective to use a metal superconductor for the superconducting sampler circuit 11 and use a high temperature superconductor only for the detection loop 12 arranged near the measurement target 13. Furthermore, if cooling requirement is less limited or the thermal interaction between the current detection circuit and the measurement target is considered small, the metal superconductor can be used for both the superconducting sampler circuit 11 and the detection loop 12.

Figure 11:
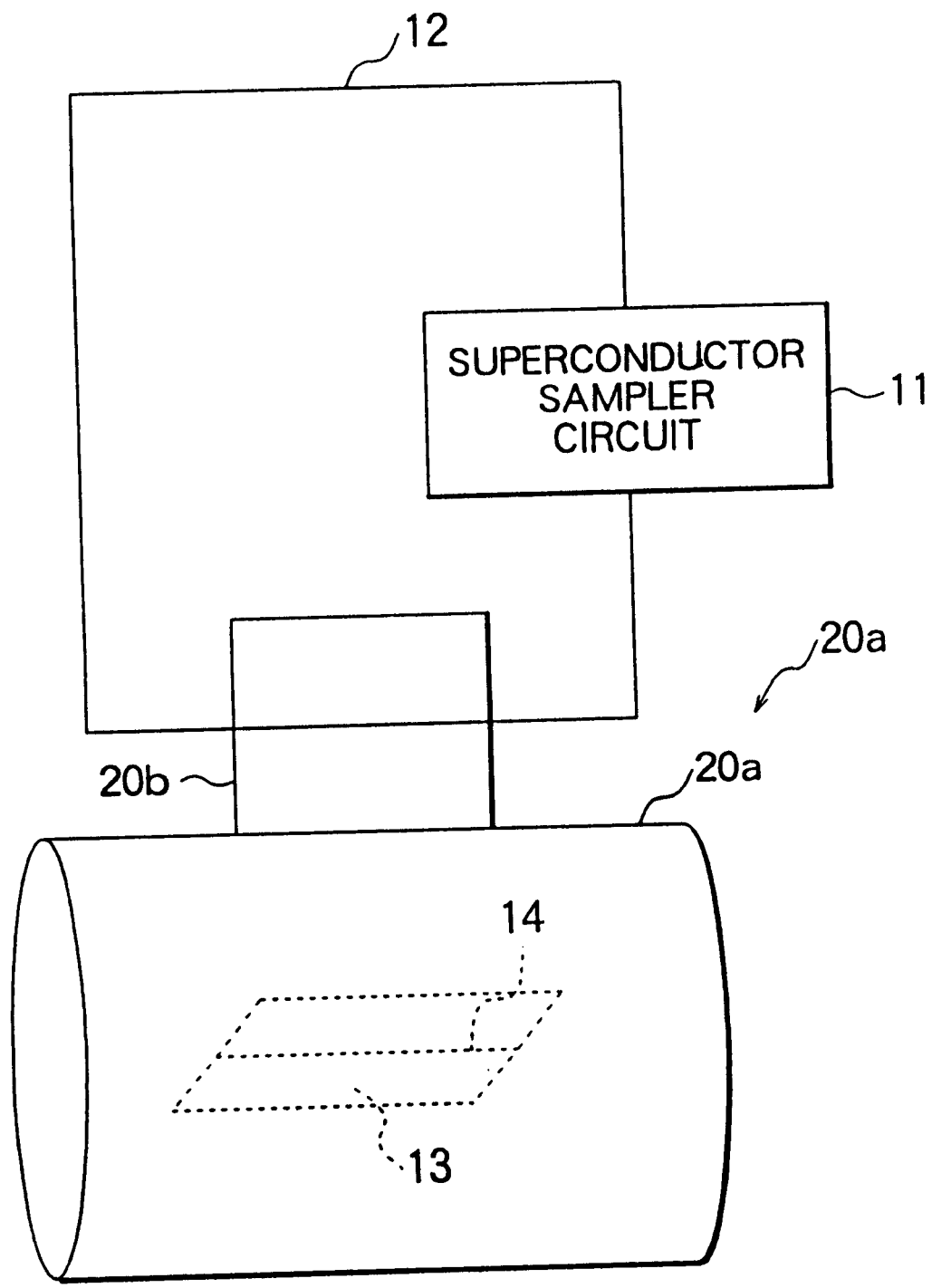
FIG. 11 is a typical view showing a superconducting current measuring circuit in the sixth embodiment according to the present invention.

Next, the sixth embodiment according to the present invention will be described. In this embodiment, a magnetic field collector which collects a magnetic field into a detection loop is provided. FIG. 11 is a typical view showing a superconducting current detection circuit in the sixth embodiment according to the present invention.

In the sixth embodiment, the magnetic field collector 20 collecting a magnetic field into the detection loop 12 is provided. The magnetic field collector 20, preferably, consists of, for example, high permeability material such as Permalloy (registered trademark). As shown in FIG. 11, a storage part 20*a* surrounding a measurement target 13 is provided. A protrusion part 20*b* protruding into the detection loop 12 is joined to the storage part 20*a*.

If a medium through which a magnetic field propagate is replaced by high permeability material, a measurement target signal current is converted to a shielding current flowing through the detection loop 12 more efficiently as can be seen from Formula (3) while the distance between the measurement target 13 and the detection loop 12 remains the same. In addition, the detection loop 12 can catch only part of a magnetic field generated by the measurement target current. However, if the magnetic field collector 20 is shaped to surround the measurement target 13, the magnetic field generated by the measurement target current flowing through the wiring 14 can be completely caught. By using the magnetic field collector 20, therefore, it is possible to apply a magnetic field to the detection loop 12 more efficiently, thus enhancing the sensitivity of the current measuring circuit.

Figure 12:
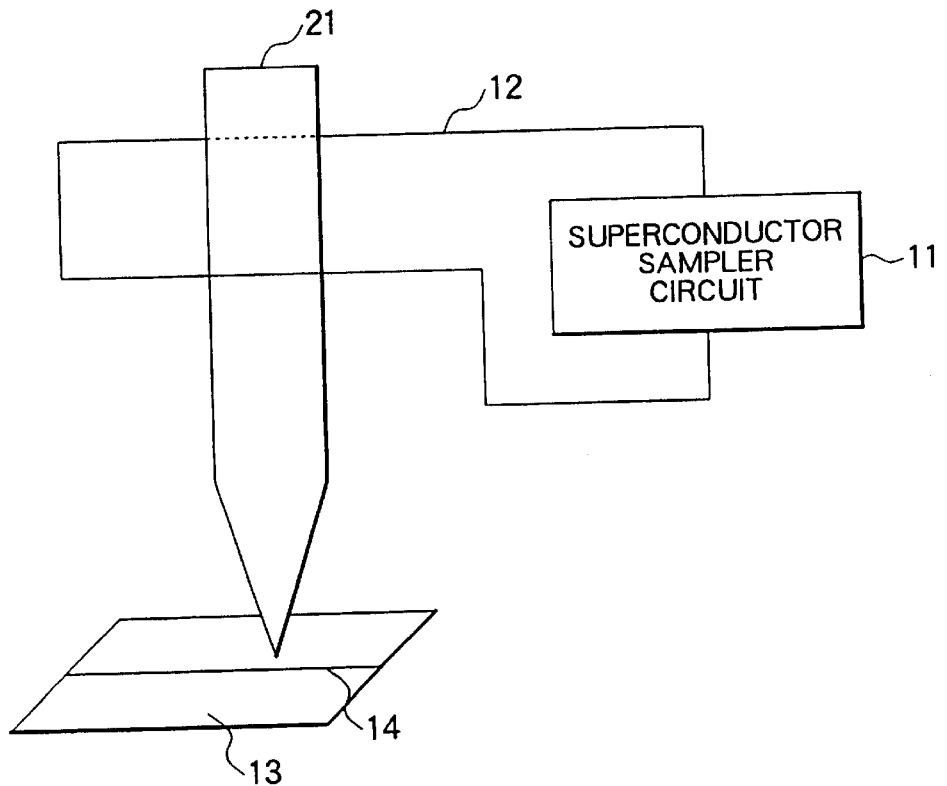
FIG. 12 is a typical view showing a superconducting current measuring circuit in the seventh embodiment according to the present invention.

Next, the seventh embodiment according to the present invention will be described. In this embodiment, a probe containing a soft magnetic material is provided as a magnetic field collector. FIG. 12 is a typical view showing a superconducting current measuring circuit in the seventh embodiment according to the present invention.

In the seventh embodiment, the probe 21 containing a soft magnetic material is provided to serve as a magnetic field collector. The probe 21 is arranged to penetrate a detection loop 12. The magnetic domain of the soft magnetic material is easily reversed by a magnetic field and $(FeMoCo)_{73}(BSi)_{27}$, for example, is known as a soft magnetic material.

If the tip end of the probe 21 containing the soft magnetic member is made closer to the wiring 14 on the measurement target 13, the magnetic domain of the magnetic member is reversed on the tip end of the probe 21 according to a magnetic field generated by a measurement target current flowing through the wiring 14. The inversion of the magnetic domain is conducted to the other end of the probe 21. Since the probe 21 penetrates the detection loop 12, the magnetic field is applied to the detection loop 12 while the reversed magnetic domain is conducted to the other end of the probe 21 and a shielding current flows through the detection loop 12.

In this embodiment, the tip end of the probe 21 can be made as narrow as about 10 nm. This makes it possible to detect a magnetic field at a desired position and to thereby enhance measurement space resolution. The advantage of the enhanced space resolution due to a probe of soft magnetic body is confirmed through an experiment using a superconducting quantum interference device microscope as described in the Extended Abstract of the Sixth International Superconductive Electronics Conference (ISEC '97), June, 1997, Vol. 3, pages 395 to 398.

The magnetic field generated by the measurement target current flowing through the wiring 14 is distributed around the wiring 14 concentrically according to the "right-handed rule". Due to this, if the probe 21 is let down perpendicularly to the wiring 14, the direction of the magnetic field right on the wiring 14 is perpendicular to the direction in which the probe 21 is let down. The direction of the magnetic field on both sides of the wiring is parallel to the direction in which the probe 21 is let down. Thus, detection sensitivity is the lowest right above the wiring 14 and the largest on both sides of the wiring 14.

To measure a measurement target current using the probe 21 with high space resolution, it is preferable that a probe 21 having a tip end curved by 90 degrees or data processing is conducted to the measurement result to thereby obtain a place in which the measurement target current flows. In this embodiment, the soft magnetic material is used as material for the probe 21. It is also possible to use high permeability material such as Permalloy (registered trademark) to efficiently introduce the magnetic field generated from the measurement target current toward the detection loop 12.

Figure 13:
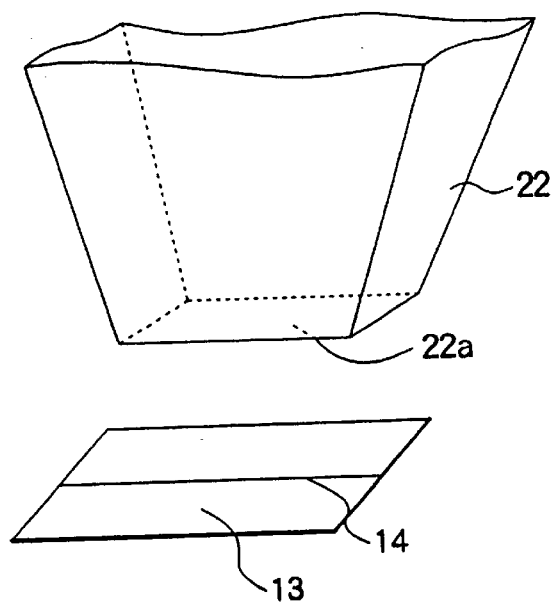
FIG. 13 is a typical view showing a superconducting current measuring circuit in the eighth embodiment according to the present invention.

Next, the eighth embodiment according to the present invention will be described. In this embodiment, the tip end of a probe serving as a magnetic field collector is rectangular. FIG. 13 is a typical view showing a superconducting current detection circuit in the eighth embodiment according to the present invention.

In the seventh embodiment, since the probe 21 having at sharp tip end is used, space resolution can enhance; however, detection sensitivity slightly deteriorates. In the eighth embodiment, by contrast, the tip end 22a of the probe 22 is rectangular. The dimensions of the tip end 22a are 1 $\mu$m in short sides and 20 $\mu$m in long sides.

If an LSI or a printed board is used as the measurement target 13, the wiring 14 is normally elongated and, in many cases, as long as 20 $\mu$m or more. The speed at which the wiring of 20 $\mu$m in length propagates current is about 0.2 pico-seconds, which speed is not more than one-tenth of the time accuracy of a superconducting sampler circuit 11. Owing to this, it is considered that a measurement target signal current flowing through the wiring of 20 $\mu$m in length is constant while the current is measured once by the superconducting sampler circuit 11.

For that reason, as the long sides of the tip end 22a of the probe 22 is longer, detection sensitivity enhances. The wiring 14 to be measured is specified by the short sides of the tip end 22a. In the eighth embodiment, the length of the short side of the tip end 22a is 1 $\mu$m. It is, therefore, possible to enhance current sensitivity by about 20 times as high as that in a case where a square probe of 1 $\mu$m in length is used.

Figure 14:
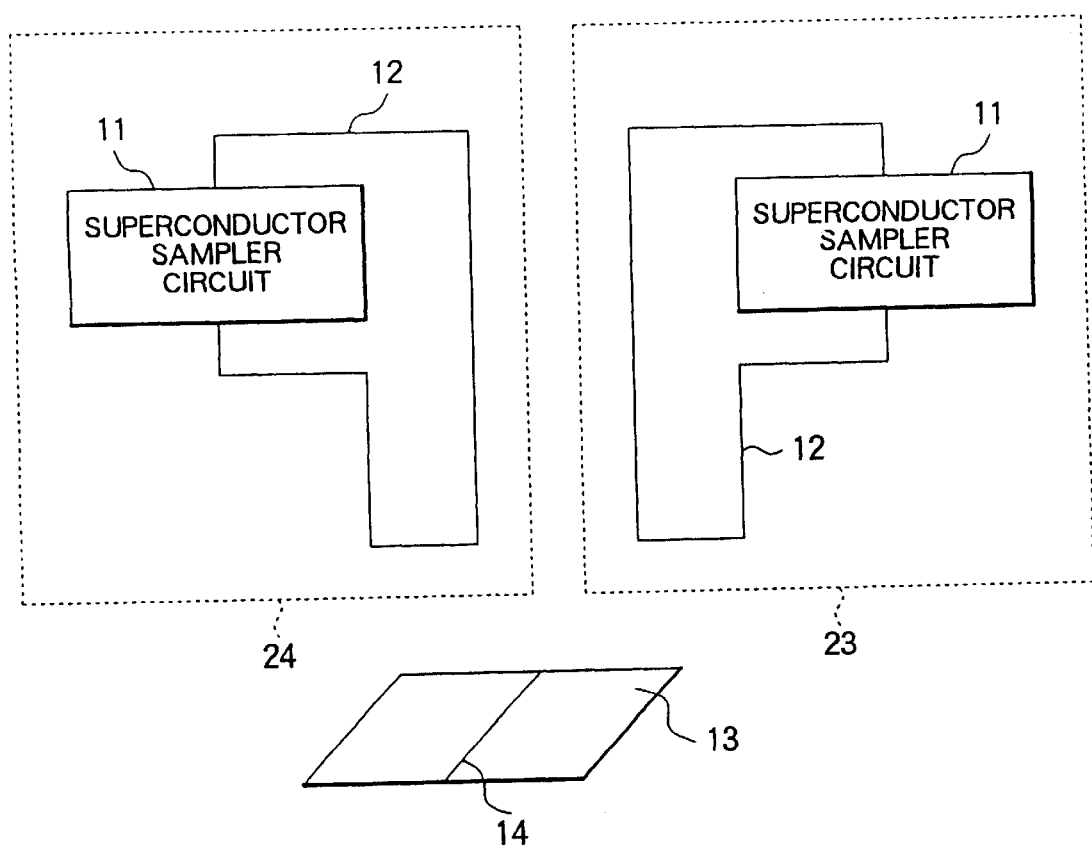
FIG. 14 is a typical view showing a combined superconducting current measuring circuit in the ninth embodiment according to the present invention.

Next, the ninth embodiment according to the present invention will be described. In this embodiment, two current measuring circuits are used. FIG. 14 is a typical view showing a combined superconducting current measuring circuit in the ninth embodiment according to the present invention.

In the ninth embodiment, superconducting current measuring circuits in one of the first to eighth embodiments are incorporated as the first current measuring circuit 23 and the second current measuring circuit 24. By using the two superconducting current measuring circuits, it is possible to simultaneously measure currents at different places. This embodiment is, therefore, effective to a case where the spatial state of current conduction and the like is to be examined or a case where information such as the positions of measurement target currents is to be obtained from the difference in detection intensity among respective current measuring circuits.

Although the two current measuring circuits are provided in this embodiment, three or more circuits may be provided. If more circuits are used, current measurement can be made more accurately. The current measuring circuits may be of different kinds from one another.

Figure 15:
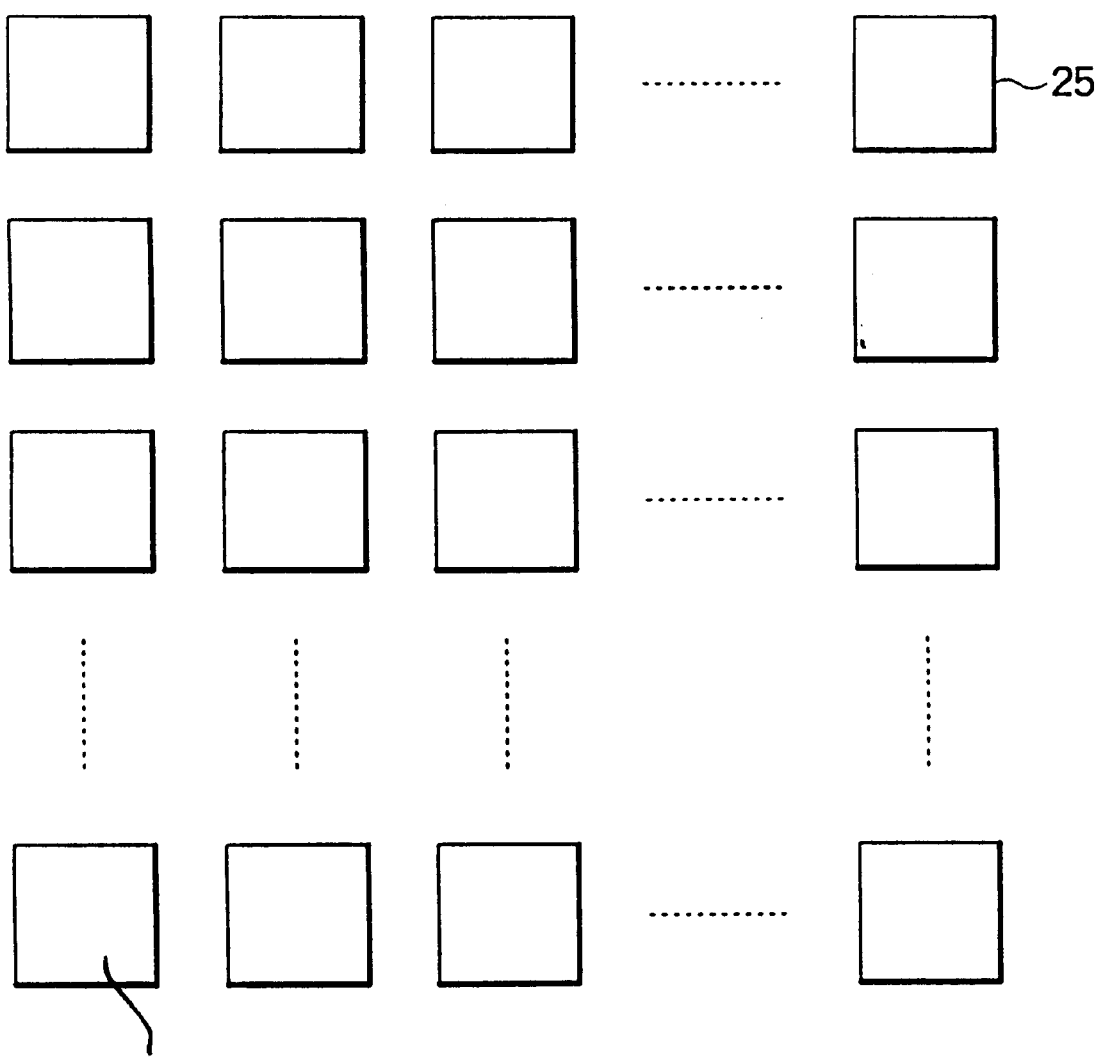
FIG. 15 is a typical view showing a combined superconducting current measuring circuit in the tenth embodiment according to the present invention.

Next, the tenth embodiment according to the present invention will be described. FIG. 15 is a typical view showing a combined superconducting current measuring circuit in the tenth embodiment according to the present invention.

In the tenth embodiment, a plurality of superconducting current measuring circuits 25 are arranged in an array. A superconducting current measuring circuit 25 is, for example, one of those in the first to eighth embodiments.

In the tenth embodiment constituted as stated above, current measuring circuits are arranged in an array, so that it is possible to measure currents in a wide range of space at once and measurement time can be reduced.

Figure 16:
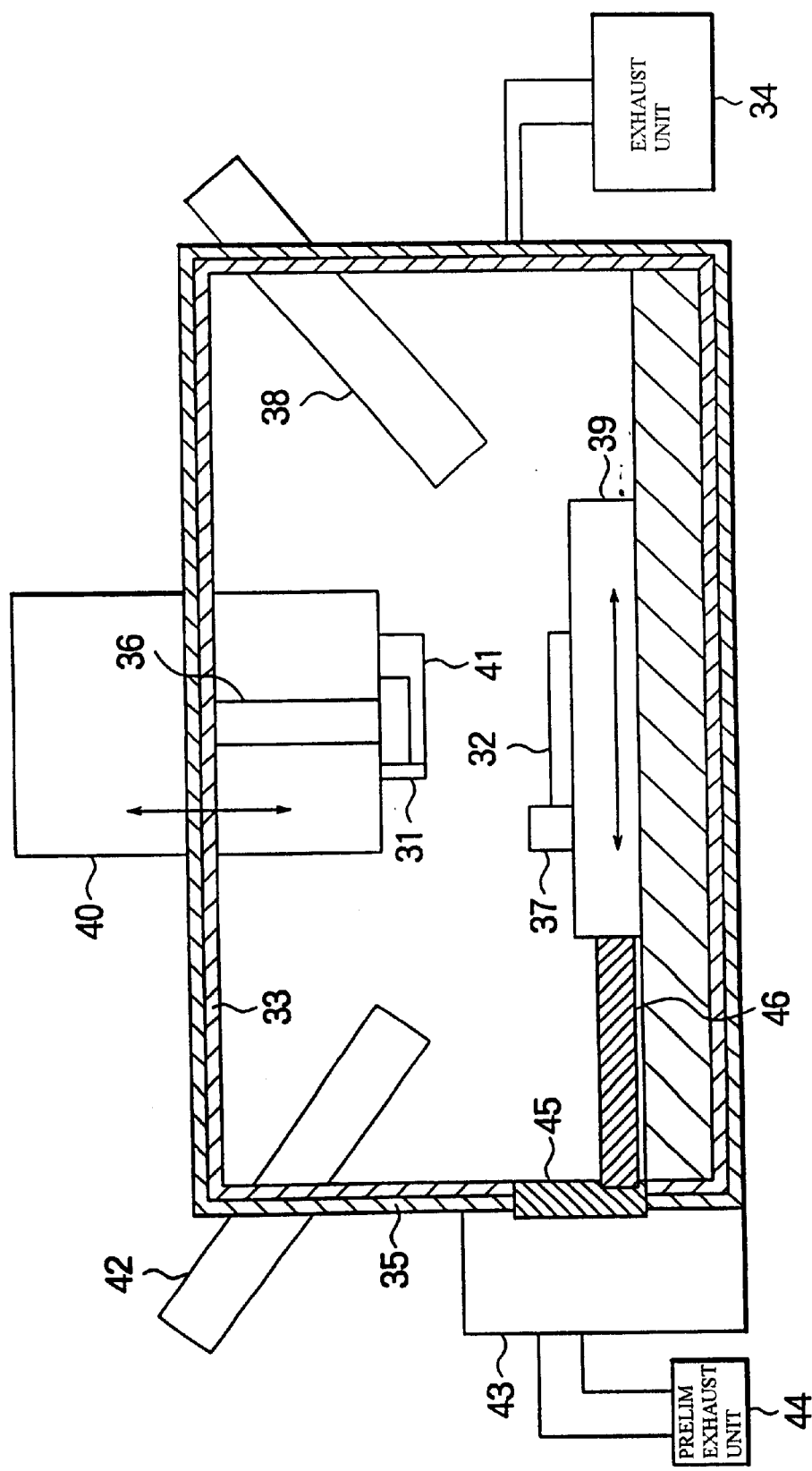
FIG. 16 is a cross-sectional view showing a superconducting current measuring device in the eleventh embodiment according to the present invention.

Next, the eleventh embodiment according to the present invention will be described. This embodiment concerns a superconducting current measuring device comprising one of the superconducting current measuring circuits in the above-stated first to tenth embodiments. FIG. 16 is a cross-sectional view showing a superconducting current measuring device in the eleventh embodiment according to the present invention.

In the eleventh embodiment, there is provided a vacuum chamber 33 in which a superconducting current measuring circuit 31 and a measurement target 32 through which a measurement target current flows are arranged. The superconducting current measuring circuit 31 is one of the circuits in the first to tenth embodiments. The detection loop of the current measuring circuit 31 is arranged in the direction perpendicular to the direction in which the measurement target current flows through the measurement target 32.

An exhaust unit 34 is coupled to the vacuum chamber 33. The vacuum chamber 33 is evacuated by the exhaust unit 34. The exhaust unit 34 is, for example, a turbo-molecular pump in which back pressure is exhausted with a rotary pump. If the current measuring circuit 31 and the measurement target 32 are arranged in the same vacuum chamber 33, it is possible to shorten the distance between them sufficiently. As indicated by the Formula (3), the detection efficiency for detecting the measurement target current using the detection loop is inversely proportional to the distance between them. Accordingly, in case that the measurement target current is low, it is quite advantageous to make the circuit 31 and the target 32 sufficiently closer to each other. The current measuring circuit 31, however, contains a superconductor and needs to be cooled. It is, therefore, essential to ensure a vacuum environment so as to prevent moisture from adhering to the circuit 31 while cooling it.

If the current measuring circuit 31 and the measurement target 32 are not arranged in the same vacuum, a wall of a vacuum chamber exists between the circuit 31 and the target 32 and it is impossible to keep the distance between them not more than a certain value. Further, if the region between the current measuring circuit 31 and the measurement target 32 is evacuated, it is possible to prevent heat propagation derived from conduction and convection and to reduce thermal interaction between.

In the eleventh embodiment, the outer surface of the vacuum chamber 33 is covered with a magnetic shield 35 made of, for example, high permeability material such as Permalloy (registered trademark). Thus, the interior of the vacuum chamber 33 is shielded from external magnetic fields such as the earth magnetic field. By shielding external magnetic fields, it is possible to measure the measurement target current more accurately.

The magnetic shield 35 may be provided inside of the vacuum chamber 33 or in the vicinity of the current measuring circuit 11. Further, by providing layers of the magnetic shields 35, it is possible to enhance the magnetic shielding effect.

In the eleventh embodiment, there is also provided a refrigerating unit 36 for cooling the superconducting current measuring circuit 31 down to its operating temperature. A pulse piping type refrigerator may be used as the refrigerating unit 36. The pulse piping type refrigerator is described in, for example, OYO BUTURI, Vol. 67, No. 4, April, 1988, pages 453 to 454.

If YBCO is used as a superconductor contained in the superconducting current measuring circuit 31, the operating temperature of the circuit 31 is about 50 K. It is confirmed that the temperature of the pulse piping type refrigerator described in the above document reaches about 20 K. It is, therefore, sufficiently possible to cool the current measuring circuit 31 using YBCO down to its operating temperature.

If the refrigerating unit 36 is used, labor required for cooling operation can be greatly reduced compared with a case where a freezing mixture such as liquid helium, which is difficult to handle is used. In addition, since the refrigerating unit 36 such as the pulse piping type refrigerator is smaller in size and lighter in weight than a cryostat using a freezing mixture such as liquid helium, the unit 36 has advantage in that the measuring device can be moved more easily.

As the refrigerating unit 36, a Stirling cryocooler or a GM (Gifford-McMahon) cryocooler using pistons other than the pulse piping type refrigerator may be employed. The Stirling cryocooler is described in, for example, OYO BUTURI, Vol. 67, No. 4, April, 1988, pages 451 to 452, and a GM (Gifford-McMahon) cryocooler is described in, for example, OYO BUTURI, Vol. 67, No. 4, April, 1988, pages 449 to 450.

In the eleventh embodiment, there is further provided a power source 37 provided with a circuit for supplying a current or voltage to the wiring of the measurement target 32. If the measurement target 32 has an electric wiring such as an LSI or a printed board, it is preferable to provide the power source 37 to supply a current or voltage to the measurement target. It is also possible to provide a power source of various types outside the device and to supply a voltage or current to the wiring of the measurement target 32 using wiring, a connector and the like.

Moreover, in the eleventh embodiment, a microscope 38 used to align the superconducting current measuring circuit 31 to the measurement target 32 is inserted from the outside of the vacuum chamber 33 into the vacuum chamber 33. This microscope 38 enables the surface of the measurement target 32 to be enlarged and observed from the outside of the vacuum chamber 33. A semiconductor laser (not shown) may be arranged in the vicinity of the current measuring circuit 31. A laser beam is radiated, as a mark, onto the surface of the measurement target 32 using the semiconductor laser. A stage 39 on which the measurement target 32 is mounted is movable by either manual or electric operation in horizontal direction.

With this constitution, if the current measuring circuit 31 is aligned to the measurement target 32, the stage 39 is moved while a marker made by the laser beam is observed with the microscope 38 and the positions of the current measuring circuit 31 and the measurement target 32 are adjusted to have a desired positional relationship.

In the eleventh embodiment, the microscope and the semiconductor laser are used as alignment members. A CCD (Charged Coupled Device) camera instead of the microscope may be used. Further, when adjusting proportional position, the current measuring circuit 31 may be moved or both the stage 39 and the current measuring circuit 31 may be moved. Besides, it is possible to install a light to illuminate the surface of the measurement target 32, to thereby make alignment further effectively.

In the eleventh embodiment, the stage 39, on which the measurement target 32, is mounted can be moved horizontally to thereby change the relatively positional relationship between the target 32 and the current measuring circuit 31, as already described above. Specifically, the stage 39 is moved, for example, by an electrically operated motor every time one measurement of a current waveform is finished, and then the next current waveform measurement is made. In this way, it is possible to obtain the current waveform distribution of the measurement target 32 by conducting measurements while changing the relative positions of the measurement target 32 and the current measuring circuit 31.

If strict moving accuracy is not required, manual operation suffices. If stricter moving accuracy is required, a piezoelectric element may be used. To change the relative positions of the current measuring circuit 31 and the measurement target 32, the current measuring circuit 31 instead of the stage 39 may be moved or both the stage 39 and the circuit 31 may be moved.

In the eleventh embodiment, there is further provided a height adjuster 40, which adjusts the distance between the current measuring circuit 31 and the measurement target 32. Specifically, the head of the refrigerating unit 36, to which the current measuring circuit 31 is attached, is movable vertically by an electrically operated motor. As described above, the amplitude of a current waveform which can be measured by the superconducting sampler circuit 11 is limited up to about 200 $\mu$A. The current measurement accuracy is about 2.5 $\mu$A. Owing to this, it is difficult to effectively measure a current with the superconducting sampler circuit 11 if the shielding current induced to the detection loop 12 is too high or too low.

In this embodiment, due to the provision of the height adjuster 40, it is possible to adjust the height of the current measuring circuit 31 so that the value of the shielding current induced to the detection loop 12 falls within a range in which a shielding current can be effectively measured with the superconducting sampler circuit 11, by adjusting the distance between the current measuring circuit 31 and the measurement target 32.

A manual motor instead of the electrically operated motor may be used. If it is preferable to adjust the distance between the current measuring circuit 31 and the measurement target 32 with high accuracy, it is effective to use a piezoelectric element. Furthermore, the measurement target 32 instead of the current measuring circuit 31 may be moved or both of them may be moved.

In the eleventh embodiment, there is also provided a radiation heat shield 41 between the current measuring circuit 31 and the measurement target 32. Since the current measuring circuit 31 contains a superconductor as already stated above, it is cooled up to very low temperature by the refrigerating unit 36 while the temperature of the measurement target 32 is normally room temperature. Due to this, there is a fear of the thermal interaction between them.

In this embodiment, the current measuring circuit 31 and the measurement target 32 are put within the vacuum chamber 33. It is not considered, therefore, that heat transfer resulting from convection and heat conduction occurs; however, it is preferable to take account of the possibility of heat transfer due to heat radiation. In this embodiment, the heat radiation shield 41 made of, for example, black plastics is provided to cover the current measuring circuit 31. This heat radiation shield 41 shields heat from the measurement target 32 flowing into the current measuring circuit 31. This ensures the stable operation of the current measuring circuit 31. In addition, the influence of this measurement on the operation of the measurement target 32 is eliminated. Since plastics does not influence magnetic field distribution, the heat radiation shield 41 has no effect on the measured current value.

The heat radiation shield 41 may be arranged in any position as long as it can prevent heat radiation between the current measuring circuit 31 and the measurement target 32.

Moreover, in the eleventh embodiment, an electromagnetic wave irradiation unit 42 radiating a high frequency electromagnetic wave such as a laser beam onto the measurement target 32, is provided to penetrate the vacuum chamber 33 and the magnetic shield 35. The electromagnetic wave irradiation unit 42 is arranged so that it can radiate an electromagnetic wave onto the surface of the measurement target 32.

If the measurement target 32 causes photoelectric transfer for generating a current due to the incidence of light and a current occurs due to the incidence of a high frequency electromagnetic wave, it is possible and effective to easily generate a current at the measurement target 32 by using the electromagnetic wave irradiation unit 42.

In the eleventh embodiment, there are provided a preliminary exhaust chamber 43 for conducting preliminary exhaust with the measurement target 32 put therein and a preliminary exhaust unit 44 for exhausting the preliminary exhaust chamber 43. A gate valve 45 is provided between the preliminary exhaust chamber 43 and the vacuum chamber 33. Furthermore, a carrier unit carrying the measurement target 32 from the preliminary exhaust chamber 43 to the stage 39.

When a new measurement target 32 is inserted into the preliminary exhaust chamber 43, the preliminary exhaust chamber 43 is exhausted by the preliminary exhaust unit 44 such as a rotary pump with the gate valve 45 closed. After the preliminary exhaust chamber 43 is sufficiently exhausted, the gate valve 45 is opened and the new measurement target 32 is carried into the vacuum chamber 33 by the carrier unit 46. After carrying the measurement target 32 into the vacuum chamber 33, the gate valve 45 is closed.

It is, therefore, possible to exchange one sample or measurement target 32 for another without breaking the vacuum of the vacuum chamber 33. At the time of sample exchange, if the vacuum of the vacuum chamber 33 is broken and the current measuring circuit 31 remains cooled, drops of water adhere to the current measuring circuit 31, thereby disadvantageously deteriorating element characteristics and/or making the next evacuation difficult. Owing to this, before breaking the vacuum of the vacuum chamber 33, it is preferable to return the temperature of the current measuring circuit 31 to room temperature and to take a lot of time to exchange samples as well as re-cooling time for the next measurement.

Since the preliminary exhaust chamber 43 is provided in this embodiment, it is possible to exchange one sample for another without breaking the vacuum of the vacuum chamber 33. The current measuring circuit 31 may remain cooled. Thus, time required for sample exchange can be reduced.

The exhaust passage of the exhaust unit 34 is switched by a valve without specially providing a preliminary exhaust unit 44.

The fundamental character of the eleventh embodiment as shown in FIG. 16 is that the superconducting current measuring circuit 31 and the measurement target 32 are arranged in the same vacuum chamber 33. The remaining constituent elements such as the exhaust unit 34 and carrier unit 46 are optional. By adding them at need, it is possible to expect the enhancement of performance and/or convenience. In this embodiment, the current measuring circuit 31 is arranged above the measurement target 32. The positional relationship between the circuit 31 and the target 32 may be reversed or they may be arranged in transverse direction.

All of the above-stated embodiments are intended at current measurement. It is, however, possible to apply the measurement method of the present invention comprising converting a magnetic field to a current by the detection loop 12 and measuring the waveform of the current by the superconducting sampler circuit 11, to the measurement of a magnetic field, such as a magnetic field changing at high speed by, for example, the rotation of the magnetic domain of a magnetic head.

The present invention has been described in detail based on the preferred embodiments; however, the present invention should not be limited to the constitutions of the above embodiments and various modifications and changes thereof should be included in the scope of the present invention.

What is claimed is:

1. A superconducting current measuring circuit comprising:

a detection loop through which a shield current flows by influence of a magnetic field generated by a measurement target current, said detection loop containing a superconductor;

a superconducting sampler circuit measuring said shield current; and a magnetic field collector which collects said magnetic field generated by said measurement target current, wherein said magnetic field collector comprises a probe containing a soft magnetic material, said probe being arranged such that a tip end thereof faces a measurement target through which said measurement target current flows and another end penetrates into said detection loop.

2. A superconducting current measuring circuit comprising:

a detection loop through which a shield current flows by influence of a magnetic field generated by a measurement target current, said detection loop containing a superconductor;

a superconducting sampler circuit measuring said shield current; and a magnetic field collector which collects said magnetic field generated by said measurement target current, wherein said magnetic field collector comprises a probe containing a soft magnetic material, said probe being arranged such that a tip end thereof faces a measurement target through which said measurement target current flows and another end penetrates into said detection loop, and wherein said probe has a rectangular section provided on the tip end thereof.

* * * * *